United States Patent [19]

Hyatt

[11] Patent Number: 4,553,109

[45] Date of Patent: Nov. 12, 1985

[54] DIGITAL DATA ACQUISITION APPARATUS

[75] Inventor: James R. Hyatt, Madison, Wis.

[73] Assignee: Nicolet Instrument Corporation, Madison, Wis.

[21] Appl. No.: 567,927

[22] Filed: Jan. 3, 1984

[51] Int. Cl.[4] .............................................. H03L 7/00
[52] U.S. Cl. ...................................... 331/25; 331/16; 307/518; 307/352
[58] Field of Search ............................ 331/14, 16, 25; 364/179; 328/151; 307/352, 353, 518

[56] References Cited

U.S. PATENT DOCUMENTS 4,136,396 1/1979 Hansford ......................... 364/179 X
4,223,180 9/1980 Eckels .............................. 307/352 X
4,366,399 12/1982 Furuhata ......................... 307/352 X Primary Examiner—Eugene R. LaRoche
Assistant Examiner—Robert J. Pascal
Attorney, Agent, or Firm—Kinney & Lange

[57] ABSTRACT

Digital data acquisition apparatus for periodically sampling a waveform. Periodic data acquisition signals are provided at predetermined intervals with the waveform being sampled at the predetermined intervals in response to the data acquisition signals. The apparatus has at least a first operation mode wherein waveform sampling is initiated on the occurrence of a trigger event. In this operation mode, the apparatus includes an improvement for increasing its effective sample rate by providing a first data acquisition signal, following a trigger event, at an interval after the trigger event that is shorter than the interval between subsequent data acquisition signals. A second mode of operation may also be provided wherein sampling is manually initiated. In either operation mode, a phase locked loop may be employed to regulate, or tune, the interval between data acquisition signals.

15 Claims, 3 Drawing Figures

DIGITAL DATA ACQUISITION APPARATUS

BACKGROUND OF THE INVENTION

1. Field of the Invention.

The analysis and study of waveforms often requires a high degree of accuracy. Since such waveforms, including impulses, may exist for very short times, their analysis study may require an ability to retain them for display for indefinite periods. Digital data acquisition apparatus of many descriptions are known which have the requisite accuracy and retention.

2. Description of the Prior Art.

FIGS. 1 and 2 are generalized representations, in schematic form, of digital data acquisition apparatus each of which include an input 10, discriminator 11, clock 12, data collector 13 and output 14. Input 10 is adapted to receive a waveform, including an impulse, and has its output connected to a discriminator 11 and to the data collector 13. The discriminator 11 may include filtering, shaping and similar functions and will typically respond to a waveform parameter to detect the occurrence of an event. The occurrence of the event (trigger event) will result in a trigger signal output from discriminator 11 representative of the occurrence of the trigger event.

In the system illustrated in FIG. 1, the trigger signal output from discriminator 11 is applied as an enable signal to data collector 13 which also receives the waveform to be sampled from input 10 and the output from the system clock 12. In the system illustrated in FIG. 2, a trigger event output from discriminator 11 is connected to the clock 12 to initiate the generation of clock pulses which are provided, as an output from the system clock 12, to the data collector 13, the data collector 13 also receiving the waveform from the input 10. In the systems of both FIGS. 1 and 2, the data collector responds to the output of the clock to periodically sample the waveform from the input 10. The sample rate is based on the clock signal rate. However, the data collector 13 may include dividers, counters, etc. such that the actual rate of data acquisition is proportional to the output rate of the clock 12. Data collector 13 may also include storage for retention of acquired data with the data acquired being provided to an output 14, either directly or from storage. The output 14 may include any desired display or combinations thereof.

One difficulty encountered with the system of the type illustrated in FIG. 1 is the variable interval between the occurrence of a trigger event and the next succeeding, in time, the data acquisition signal from the clock 12. An advantage is that the system of FIG. 1 allows the use of a high quality oscillator for the clock 12 which reduces the variability of the intervals at which sampling of the waveform is performed. In contrast, the system illustrated in FIG. 2 employs a clock which is triggered by the trigger event, and, by implication, is an oscillator having a relatively low quality factor to provide rapid start up. This low quality factor has an inherent variability in the timing of the sampling of the waveform.

SUMMARY OF THE INVENTION

The present invention provides digital data acquisition apparatus wherein sampling occurs at stable predetermined intervals and in which the variability of the interval between the occurrence of a trigger event and the first subsequent data acquisition signal is kept at a minimum. Through the use of the present invention, the effective sampling rate of the waveform being sampled is increased without a corresponding increase in the memory necessary to store the sampled data points. In a preferred embodiment, the present invention employs a phase locked loop to provide a frequency control for the data acquisition signals while a prescaler is preset to determine the interval between the occurrence of a trigger event and the first following data acquisition signal. A second mode of operation is disclosed in which sampling is manually initiated with the time of occurrence of a trigger event, relative to the sampling sequence, being stored for use during processing.

DETAILED DESCRIPTION OF THE PREFERRED EMBODIMENTS

Figure 1:
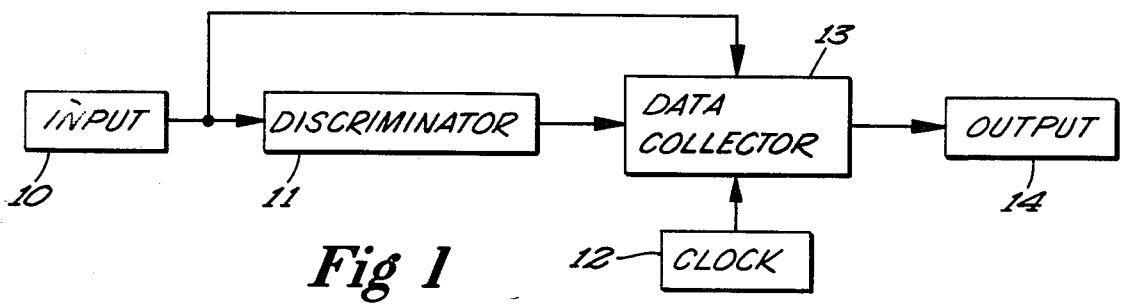
FIGS. 1 and 2 are diagramatic illustrations of data acquisition apparatus that serve to illustrate the operation of a preferred embodiment of the present invention.
Figure 2:
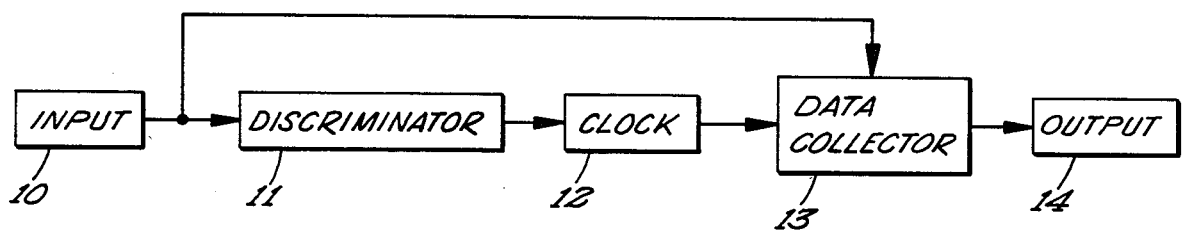
Figure 3:
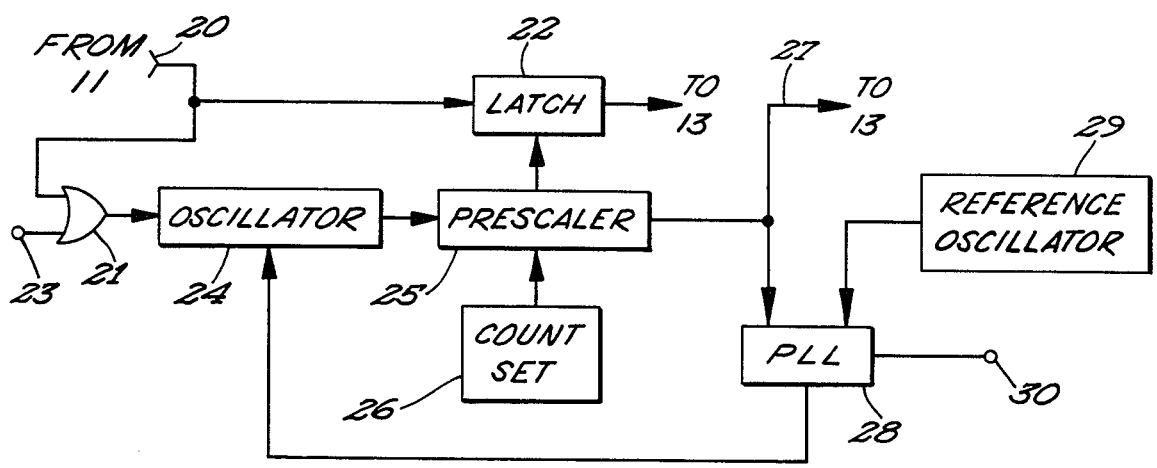
FIG. 3 illustrates an implementation of a preferred embodiment of the present invention that may serve as substitute for portions of the systems illustrated in FIGS. 1 and/or 2.

FIG. 3 illustrates an implementation of a preferred embodiment of the present invention which may serve to receive the output from the discriminator 11 of either of the systems of FIGS. 1 or 2 to provide a data acquisition signal to the data collector 13 of either of those systems. In essence, FIG. 3 illustrates an alternative to the clock pulse generators 12 of the systems of FIGS. 1 and 2 and also addresses the shortcomings of those clock pulse generators. Throughout the drawings like reference numerals designate funcitonally similar, if not identical, components.

As shown in FIG. 3, a terminal 20 is adapted for connection to the outut from discriminator 11 and is connected as an input to an OR gate 21 and to a latch 22. A second terminal 23, to be described below, is also connected to an input of the OR gate 21, the output of the OR gate 21 being connected to an oscillator 24. The output of the oscillator 24 is connected to a prescaler 25, the prescaler 25 being connected to receive a control signal from a count set function 26 and having its output connected to the latch 22. As will be described more fully below, the prescaler 25 provides data acquisition signals which are delivered to the data collector 13 via line 27 and to a phase locked loop (PLL) 28. A reference oscillator 29 is connected to the phase locked loop while the output of the phase locked loop 28 is connected to the oscillator 24. A terminal 30 is connected to the lock control of the phase locked loop 28.

The oscillator 24 is a gatable oscillator which starts its oscillations on the appearance of an output from the OR gate 21. Thus, either a trigger event, as established by discriminator 11, or a manual "run" signal applied to terminal 23 will initiate operation of the oscillator 24. In a preferred embodiment, the oscillator 24 has a 500 MHz output which is applied to the prescaler 25.

The prescaler is a presettable divide by ten high speed counter. That is, with a 500 MHz output from the oscillator 24, the output from the prescaler 25 that is applied to the line 27 and the phase locked loop 28 is a 50 MHz signal. Thus, in this embodiment, data acquisition signals are applied to the data collector 13 at a 50 MHz frequency. However, the initial count in the prescaler 25 may be set by the count set function 26, in known manner, such that the initial data acquisition signal applied to the data collector 13, via line 27, will occur at a shorter interval after the trigger event than subsequent data acquisition signal occur after each other. In this manner, the "effective" sampling rate of a data acquisition device employing the present invention will be greater than that estabished by the period or interval between data acquisition signals appearing on line 27 in that the first data acqustion signal following a trigger event may be present to an interval shorter than the intervl between subsequent data acquisition signals. It should be noted that this increase in the effective sampling rate is accomplished without a corresponding increase in memory that might otherwise be necessary if sampling were continued at the same interval between data acquisition signal as exists between a trigger event and a first data acquisition signal. Of course, the rate at which data is acquired must be sufficiently "fast" to be reliable.

The reference oscillator 29 is selected to produce a very stable reference frequency against which the frequency of the output of the prescaler 25 is compared. In known manner, the phase locked loop 28 provides a control voltage to the oscillator 24 to adjust the frequency of the oscillator 24 to establish or "tune" the output of the oscillator 24 at the desired rate - 500 MHz in the example given. Since the oscillator 24 must start rapidly on the occurrence of a trigger event, that oscillator must be of a relatively low quality factor. The instability in frequency that results from this low quality factor is offset by the tuning of the output frequency of oscillator 24 by the phase locked loop 28. Thus, the oscillator 24 not only has a rapid start-up but provides a very accurate stable frequency during continued operation. The mode of operation of the phase locked loop 28 is controlled at terminal 30. When locked, the PLL will continually monitor the output of the reference oscillator 29 and prescaler 28 to provide a control voltage to oscillator 24. When the phase locked loop 28 is not locked, the control voltage applied to the oscillator 24 is "remembered" and is not changed until the phase locked loop is again locked, in known manner.

In a first mode of operation, the apparatus of FIG. 3 will have a trigger event applied to line 20 to result in a gating of the ocsillator 24. The prescaler 25 will be preset by the count set function 26, in known manner, to provide its first data acquisition signal after a predetermined number of output signals from the oscillator 24. Subsequent data acquistion signals are provided by the prescaler 25 in accordance with its division function. Normally, the prescaler 25 will be preset by count set function 26 such that the interval between a trigger event and the first data acquisition signal will be less than the interval between subsequent data acquisition signals. The variability between subsequent data acquistion signals is minimized by the phase locked loop 28 responding to the output of the prescaler 25 and reference oscillator 29 to provide a control voltage for the oscillator 24. As noted above, a control voltage for oscillator 24 is provided in both locked and unlocked states of the PLL.

With the reference oscillator 29 operating an appropriate application of a signal at the terminals 23 and 30, for a short inverval, will "tune" the oscillator 24 output frequency to the desired rate. Those signals can then be removed to stop the operation of the oscillator 24 and unlock the phase locked loop 28. A subsequent trigger event will again gate the oscillator 24 with the phase locked loop 28 "remembering" previously applied controlled voltage to the oscillator 24 to apply that voltage during the desired data acquisition interval. The intermittent application of signals to terminals 23 and 30 may be employed to periodically "tune" the oscillator 24 to assure operation of the oscillator 24 at the desired rate and may be accomplished at regular intervals by automatic timing systems. During this "timing," it may be desirable to disable input 10, or block its output, to prevent the acquisition of data.

A second mode of operation allows data acquisition during the interval prior to the occurrence of a trigger event. In this operation mode, a signal is applied to the terminals 23 and 30 to manually initiate the oscillator 24 with the phase locked loop 28 being locked. Thus, the oscillator 24 is operating at a very stable rate. On the occurrence of a trigger event, that occurrence is detected by the latch 22 which stores the count of the prescaler 25 so that the time of occurrence of a trigger event may be taken into account during processing of the acquired data. This is indicated in FIG. 3 by the output from latch 22 that indicates that the count of prescaler 25 at the time of occurrence of a trigger event is transmitted to the data collector 13.

Obviously, many modifications and variations of the present invention are possible in light of the above teachings. It is therefore to be understood that, within the scope of the appended claims, the invention may be practiced otherwise than as specifically described.

I claim:

1. In digital data acquistion apparatus of the type wherein a waveform is periodically sampled and having means for providing periodic data acquisition signals at predetermined intervals and means responsive to said data acquisition signals for sampling said waveform at said predetermined intervals, the apparatus having at least a first operation mode wherein said sampling is initiated on the occurrence of a trigger event, the improvement for increasing the effective sample rate of the apparatus wherein said data acquisition signals providing means is initiated, in said first operation mode, by said trigger event and including means for generating a first data acquisition signal at an interval after a trigger event that is shorter than said predetermined intervals and for generating subsequent data acquisition signals at said predetermined intervals.

2. The digital data acquisition apparatus of claim 1 wherein said data acquisition signals providing means comprises:
   gatable oscillator means responsive to the occurrence of a trigger event for providing periodic signals having a high frequency relative to said data acquisition signal; and
   presettable counter means connected to receive said high frequency signals for providing a data acquisition signal after a predetermined number of said high frequency signals.

3. The digital data acquisition apparatus of claim 2 further comprising phase locked loop means responsive to said data acquisition signals for establishing the freauency of said gatable oscillator means.

4. The digital data acquisition apparatus of claim 3 wherein said phase locked loop means is intermittently operated.

5. The digital data acquisition apparatus of claim 2 further comprising means for periodically, and intermittently, tuning the frequency of said gatable oscillator means.

6. The digital data acquisition apparatus of claim 5 wherein said tuning means comprises means responsive to the frequency of said data acquisition signals and a reference frequency signal for providing a frequency control signal for said gatable oscillator means, said frequency control signal providing means being intermittently operable to adjust said frequency control signal while maintaing said frequency control signal between intermittent adjustments.

7. The digital data acquisition apparatus of claim 6 wherein said frequency control signal providing means comprises phase locked loop means.

8. The digital data acquisition apparatus of claim 1 wherein said apparatus has a second operation mode in which sampling is manually initiated, said apparatus further comprising memory means responsive to a trigger event for storing the relative time of occurrence of said trigger event.

9. The digital data acquisition apparatus of claim 2 wherein said apparatus has a second operation mode in which sampling is manually initiated, said apparatus further comprising memory means responsive to a trigger event for storing the count of said presettable counter means at the time of occurrence of said trigger event.

10. The digital data acquisition apparatus of claim 9 wherein said memory means comprises latch means connected to said presettable counter means.

11. The digital data acquisition apparatus of claim 10 further comprising phase locked loop means responsive to said data acquisition signals for establishing the frequency of said gatable oscillator means.

12. The digital data acquisition apparatus of claim 11 wherein said phase locked loop means is intermittently operated.

13. The digital data acquisition apparatus of claim 10 further comprising means for periodically, and intermittently, tuning the frequency of said gatable oscillator means.

14. The digital data acquisition apparatus of claim 13 wherein said tuning means comprises means responsive to the frequency of said data acquisition signals and a reference frequency signal for providing a frequency control signal for said gatable oscillator means, frequency control signal providing means being intermittently operable to adjust said frequency control signal while maintaining said frequency control signal between intermittent adjustments.

15. The digital data acquisition apparatus of claim 14 wherein said frequency control signal providing means comprises phase locked loop means.

* * * * *

UNITED STATES PATENT AND TRADEMARK OFFICE
CERTIFICATE OF CORRECTION

PATENT NO. : 4,553,109

DATED : November 12, 1985

INVENTOR(S) : James R. Hyatt

It is certified that error appears in the above-identified patent and that said Letters Patent is hereby corrected as shown below:

Column 4, lines 62-63, the word "freauency" should read --frequency--.

In claim 14, lines 19-20, the phrase "oscillator means, frequency" should read --oscillator means, said frequency --.

Signed and Sealed this

Fourth Day of March 1986

[SEAL]

Attest:

DONALD J. QUIGG

Attesting Officer

Commissioner of Patents and Trademarks